United States Patent
Deo et al.

(10) Patent No.: US 11,512,688 B2
(45) Date of Patent: Nov. 29, 2022

(54) MODULE FOR A VACUUM PUMPING AND/OR ABATEMENT SYSTEM

(71) Applicant: Edwards Limited, Burgess Hill (GB)

(72) Inventors: Hammond Deo, Burgess Hill (GB); Helen Shaw, Burgess Hill (GB)

(73) Assignee: Edwards Limited, Burgess Hill (GB)

( * ) Notice: Subject to any disclaimer, the term of this patent is extended or adjusted under 35 U.S.C. 154(b) by 268 days.

(21) Appl. No.: 16/763,525

(22) PCT Filed: Nov. 9, 2018

(86) PCT No.: PCT/GB2018/053243
§ 371 (c)(1),
(2) Date: May 12, 2020

(87) PCT Pub. No.: WO2019/092429
PCT Pub. Date: May 16, 2019

(65) Prior Publication Data
US 2020/0300234 A1    Sep. 24, 2020

(30) Foreign Application Priority Data

| Nov. 13, 2017 | (GB) | 1718752 |
| Mar. 27, 2018 | (GB) | 1804937 |
| May 31, 2018 | (GB) | 1808944 |

(51) Int. Cl.
*F04B 37/14* (2006.01)
*F04B 39/12* (2006.01)
(Continued)

(52) U.S. Cl.
CPC ............ *F04B 39/121* (2013.01); *F04B 37/14* (2013.01); *F04B 39/123* (2013.01); *F04B 39/14* (2013.01);
(Continued)

(58) Field of Classification Search
CPC ........ B01D 53/00; F04B 37/14; F04B 39/121; F04B 39/123; F04B 39/14; F04B 41/00
See application file for complete search history.

(56) References Cited

U.S. PATENT DOCUMENTS

| 4,184,810 A | * | 1/1980 | Dyhr | ...................... F04B 29/00 |
| | | | | 417/372 |
| 5,536,317 A | * | 7/1996 | Crain | ................... C08G 61/025 |
| | | | | 118/712 |

(Continued)

FOREIGN PATENT DOCUMENTS

| CN | 203924215 U | 11/2014 |
| CN | 102667644 B | 3/2016 |

(Continued)

OTHER PUBLICATIONS

Combined Search and Examination Report under Sections 17 and 18(3) dated Oct. 31, 2018 in counterpart GB Application No. 1808944.1, 5 pp.

(Continued)

*Primary Examiner* — Dominick L Plakkoottam
(74) *Attorney, Agent, or Firm* — Shumaker & Sieffert, P.A.

(57) ABSTRACT

A module for a vacuum pumping and/or abatement system. The module comprises a frame defining a space, a plurality of facilities inputs configured to receive facilities from a facilities supply, a plurality of facilities outputs configured to output the received facilities out of the module, and a plurality of facilities connection lines located at least partially within the space defined by the frame. The plurality of facilities connection lines connect the facilities inputs to the facilities outputs. The module further comprises a controller configured to control supply of facilities received at the facilities inputs out of the facilities outputs; and control (Continued)

operation of one or more vacuum pumping and/or abatement apparatuses remote from the module.

14 Claims, 6 Drawing Sheets

(51) Int. Cl.
    *F04B 39/14*     (2006.01)
    *F04C 25/02*     (2006.01)
    *F04B 41/00*     (2006.01)
    *F16L 51/04*     (2006.01)
    *F04C 23/00*     (2006.01)
    *F16L 53/35*     (2018.01)
    *F16L 23/08*     (2006.01)
    *C23C 16/44*     (2006.01)

(52) U.S. Cl.
    CPC .............. *F04B 41/00* (2013.01); *F04C 23/00* (2013.01); *F04C 25/02* (2013.01); *F16L 23/08* (2013.01); *F16L 51/04* (2013.01); *F16L 53/35* (2018.01); *C23C 16/4412* (2013.01); *F04C 2240/30* (2013.01); *F04C 2240/70* (2013.01); *F04C 2240/81* (2013.01)

(56) References Cited

U.S. PATENT DOCUMENTS

| | | | | |
|---|---|---|---|---|
| 5,769,626 | A * | 6/1998 | Hauff | B01D 53/00 417/205 |
| 7,824,500 | B1 * | 11/2010 | Sarver | C23C 16/4407 134/8 |
| 8,727,456 | B1 * | 5/2014 | Bullock | H02B 1/36 312/223.2 |
| 9,740,184 | B2 * | 8/2017 | Loldj | G05B 19/00 |
| 2002/0025286 | A1 * | 2/2002 | Gravley | B01D 53/32 423/489 |
| 2003/0173490 | A1 * | 9/2003 | Lappen | B23Q 1/01 248/678 |
| 2006/0207230 | A1 * | 9/2006 | DeMarco | B01D 45/08 55/319 |
| 2009/0078208 | A1 * | 3/2009 | Hakes | A01K 13/003 119/14.18 |
| 2012/0189478 | A1 * | 7/2012 | Dreifert | F04C 23/001 418/5 |
| 2012/0261011 | A1 * | 10/2012 | Cho | F04C 23/005 137/565.15 |
| 2013/0276702 | A1 * | 10/2013 | Carlson | C23C 16/4412 422/169 |
| 2014/0352820 | A1 * | 12/2014 | Nakazawa | B01D 53/74 422/168 |
| 2015/0260192 | A1 * | 9/2015 | Iwasaki | B01D 53/323 415/183 |
| 2017/0049606 | A1 * | 2/2017 | Chen | A61F 5/56 |
| 2017/0082345 | A1 * | 3/2017 | Espinosa | A47B 88/40 |
| 2018/0130681 | A1 | 5/2018 | Tanifuji et al. | |
| 2018/0226234 | A1 * | 8/2018 | Dickinson | B01D 53/32 |
| 2018/0366307 | A1 * | 12/2018 | Dickinson | B01D 53/68 |
| 2020/0340466 | A1 * | 10/2020 | Deo | F16L 53/35 |

FOREIGN PATENT DOCUMENTS

| | | | |
|---|---|---|---|
| CN | 107110161 A | 8/2017 | |
| DE | 102015121905 A1 | 6/2017 | |
| EP | 1085206 A1 | 3/2001 | |
| EP | 1109204 A2 | 6/2001 | |
| WO | 2011060415 A2 | 5/2011 | |
| WO | 2011060415 A3 | 5/2011 | |
| WO | WO-2013144581 A1 * | 10/2013 | .............. F04B 37/14 |
| WO | 2016110694 A1 | 7/2016 | |
| WO | 2016185984 | 11/2016 | |

OTHER PUBLICATIONS

International Search Report and Written Opinion dated Feb. 20, 2019 from counterpart International Application No. PCT/GB2018/053243, 13 pp.

"ADC Active Digitale Controller", Product catalogue 2016/2017, pp. 1,392-393,518, Jan. 1, 2016 (Jan. 1, 2016), Edwards Vacuum Ltd., 4 pp.

* cited by examiner

MODULE FOR A VACUUM PUMPING AND/OR ABATEMENT SYSTEM

This application is a national stage entry under 35 U.S.C. § 371 of International Application No. PCT/GB2018/053243, filed Nov. 9, 2018, which claims the benefit of GB Application 1808944.1, filed May 13, 2018; GB Application 1804937.9, filed Mar. 27, 2018; and GB Application 1718752.7, filed Nov. 13, 2017. The entire contents of International Application No. PCT/GB2018/053243; GB Application 1808944.1, GB Application 1804937.9; and GB Application 1718752.7 are incorporated herein by reference.

TECHNICAL FIELD

The present disclosure relates to vacuum pumping and/or abatement systems.

BACKGROUND

Vacuum pumping and abatement systems are used in varied and different technological fields, for example semiconductor fabrication. Typically, in said systems, vacuum pumping equipment is used to pump gas (e.g. gas from an industrial process) out of a particular location, and abatement equipment is used to abate (e.g. destroy or dispose of) undesirable substances (e.g. exhaust gas) which have been produced.

Depending on the processes involved, there may be different criteria for vacuum pumping and abatement. For example, it is typically desirable to use different vacuum pumping equipment and/or different abatement equipment for different processes involving different process gases, different gas pressures, and different gas flow. Also, it is typically desirable to use different abatement equipment to destroy or dispose of different undesirable substances.

Vacuum pumping and abatement systems are typically designed bespoke according to the particular processes with which they will be used. However, the amount of time spent designing, manufacturing and installing such a bespoke system is typically prolonged because different processes require different vacuum pumping and abatement system solutions.

SUMMARY

In a first aspect, there is provided a module for a vacuum pumping and/or abatement system. The module comprises a frame defining a space, a plurality of facilities inputs configured to receive facilities from a facilities supply, a plurality of facilities outputs configured to output the received facilities out of the module, and a plurality of facilities connection lines located at least partially within the space defined by the frame. The plurality of facilities connection lines connect the facilities inputs to the facilities outputs. The module further comprises a controller configured to control supply of facilities received at the facilities inputs out of the facilities outputs; and control operation of one or more vacuum pumping and/or abatement apparatuses remote from the module.

The module may have a width which is less than or equal to 0.5 m.

The module may have a width which is less than or equal to 0.15 m.

The module may further comprise a tool interface configured to receive a tool signal from a tool. At least some of the control performed by the controller may be based on the tool signal.

The plurality of facilities inputs may be located at or proximate to a common side of the module.

The plurality of facilities outputs may each be located at or proximate to a lateral side of the module.

The tool interface may be located at or proximate to a top side of the module.

The common side may be a top side of the module.

The module may further comprise a user interface configured to display information associated with the vacuum pumping and/or abatement system, receive a user input, and send a signal to the controller based on the user input.

The module may further comprise a drawer slidably mounted to the frame and configured to slide in and out of an opening in the frame. The controller may be mounted to the drawer such that the controller is able to slide out of the opening in the frame along with the drawer.

The frame may comprise at least one foot which is configured to be adjusted to vary a height of the module.

The facilities may include one or more facilities selected from the group consisting of: facilities fluid, electrical power, electrical signals, and optical signals.

The facilities may include facilities fluid selected from the group consisting of: liquid coolant, city water, de-ionised water, clean dry air, methane, oxygen, nitrogen, and hydrogen.

In a second aspect, there is provided a vacuum pumping and/or abatement system. The system comprises a module in accordance with the first aspect and one or more other modules connected to the module. At least one of the one or more other modules comprises a vacuum pumping and/or abatement apparatus.

The vacuum pumping and/or abatement system may be an integrated system. The term "integrated system" may be used to refer to two or more modules integrated together into a common system, the modules being selected from the group of modules consisting of: a module comprising vacuum pumping apparatus, a module comprising process gas abatement apparatus, and a module comprising a controller for controlling the vacuum pumping and/or abatement apparatuses.

In a third aspect, there is provided a method for installing a vacuum pumping and/or abatement system comprising positioning a module in accordance with the first aspect at a location, positioning one or more other modules of the vacuum pumping and/or abatement system adjacent to the module, connecting the plurality of facilities inputs of the module to a facilities supply using a plurality of facilities input lines, and connecting the plurality of facilities outputs of the module to the one or more other modules using facilities distribution lines.

DETAILED DESCRIPTION

Figure 1:
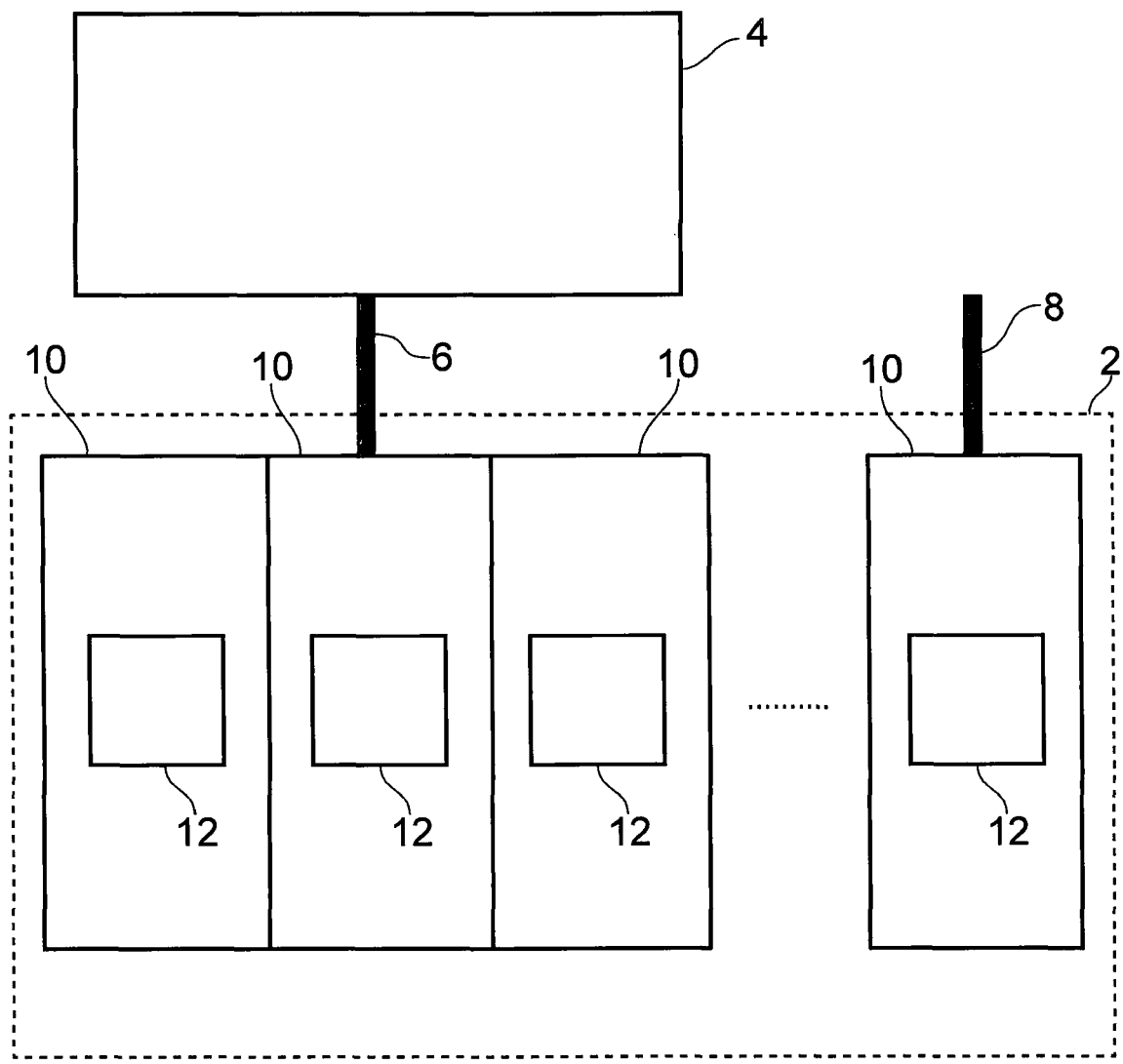
FIG. 1 is a schematic illustration (not to scale) showing a vacuum pumping and/or abatement system.

FIG. 1 is a schematic illustration (not to scale) showing a vacuum pumping and/or abatement system 2. The system 2 is fluidly connected to an entity 4 via a fluid input line 6, commonly referred to as a "foreline", between the system 2 and the entity 4. The entity 4 may, for example, be a chamber or room used in an industrial process such as semiconductor fabrication. The system 2 is also fluidly connected to an exhaust line 8.

In operation, the system 2 pumps gas out of the entity 4 via the fluid input line 6 and/or abates (e.g. destroys or disposes of) undesirable substances produced by the entity 4 which may be present in the pumped gas. The system 2 also pumps exhaust gas (which may be gas which has undergone an abatement process) out of the system 2 into the exhaust line 8, thereby to remove the exhaust gas from the system 2.

The system 2 comprises a plurality of modules 10, which may also be referred to as "units" or "slices". The term "module" is used herein to refer to a discrete part of the system 2 which is removable from the rest of the system 2. Each module 10 comprises one or more apparatuses 12. Each apparatus 12 is configured to perform a respective function within the system 2. For example, an apparatus 12 may be a vacuum pump for pumping gas out of the entity 4, an abatement apparatus for abating undesirable substances produced by the entity 4, an inverter for converting DC electrical power into AC electrical power, or an electronic controller for controlling operation of all or part of the system 2. However, the one or more apparatuses 12 are not limited as such. In general, each of the apparatuses 12 may be any apparatus which is used in a vacuum pumping and/or abatement system. In some embodiments, two or more of the apparatuses 12 are substantially identical and/or perform substantially the same function as each other.

Figure 2:
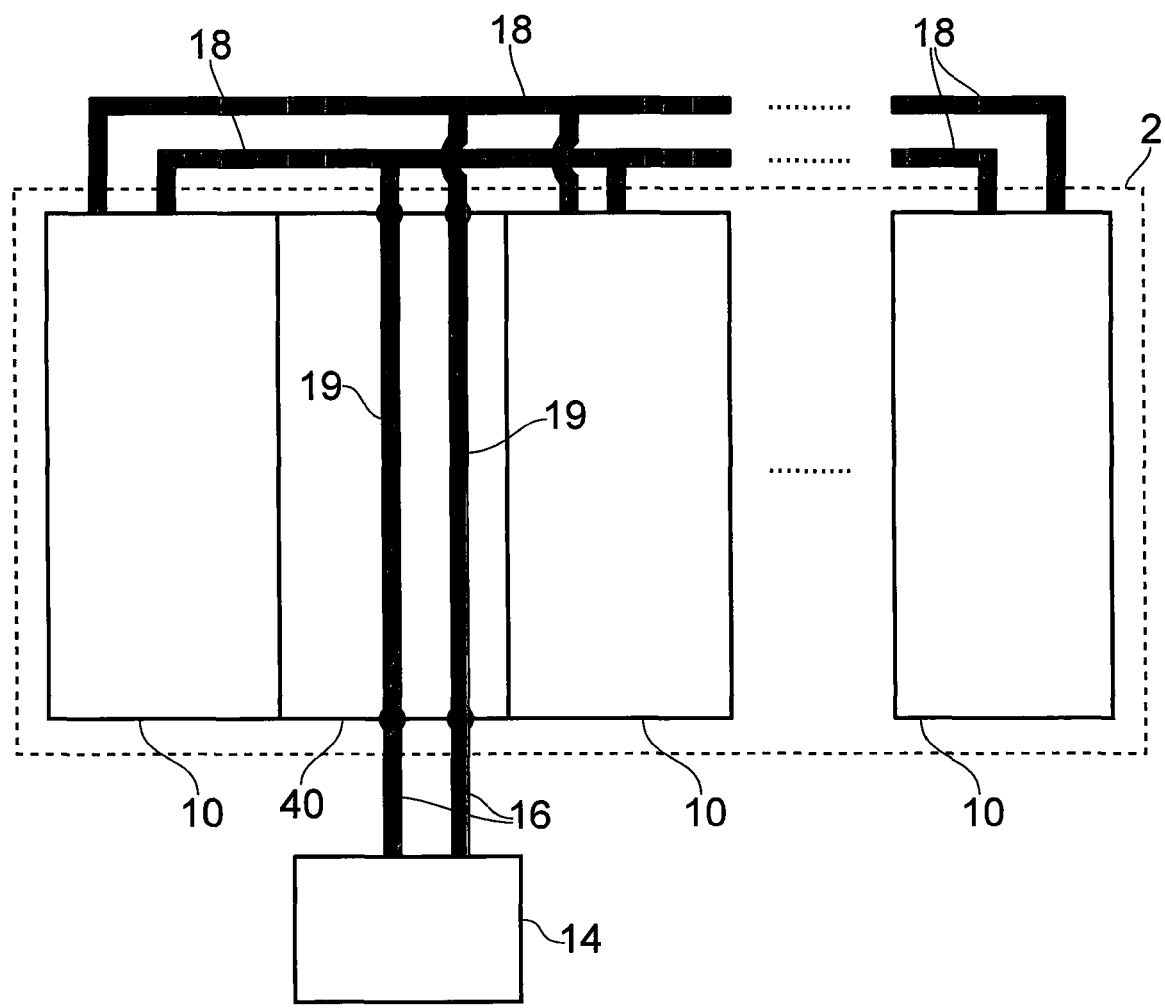
FIG. 2 is a schematic illustration (not to scale) showing facilities lines of the vacuum pumping and/or abatement system.

FIG. 2 is a schematic illustration (not to scale) showing facilities lines of the vacuum pumping and/or abatement system 2. The term "facilities" is used herein to refer to resources which are used by the system 2 to support the main pumping/abatement function of the system 2. These facilities allow the system 2 to operate properly during use. Examples of facilities include facilities fluids (e.g. liquid coolant, city water, de-ionised water, clean dry air, methane, oxygen, nitrogen, hydrogen), electrical power and/or electrical signals carried by electrical connections, and optical signals carried by optical connections (e.g. optical fibres).

The system 2 is connected to a facilities supply 14 by a plurality of facilities input lines 16. In operation, the system 2 receives facilities from the facilities supply 14 via the plurality of facilities input lines 16.

More specifically, the system 2 comprises a facilities module 40 which is connected to the facilities supply 14 by the plurality of facilities input lines 16.

The term "facilities module" is used herein to refer to a particular module of the system 2 at which the facilities used by the system 2 enter the system 2 from the facilities supply 14. In this embodiment, the facilities module 40 does not comprise any vacuum pumping and/or abatement apparatus itself.

The facilities module 40 is connected to other modules 10 of the system 2 by a plurality of facilities distribution lines 18. The facilities input lines 16 are connected to the facilities distribution lines 18 by facilities connection lines 19 of the facilities module 40.

In operation, the facilities module 40 receives facilities from the facilities supply 14 via the plurality of facilities input lines 16. The received facilities are then conveyed through the facilities module 40, by the facilities connection lines 19 of the facilities module 40, to the facilities distribution lines 18. The facilities are then conveyed, by the facilities distribution lines 18, to the other modules 10 of the system 2, thereby to supply facilities to the other modules 10. In this way, all of the facilities received by the system 2 from the facilities supply 14 enter the system 2 at a single module of the system 2 (i.e. the facilities module 40) and are distributed to the rest of the system 2 from that single module.

The facilities module 40 will be described in more detail below with reference to FIG. 5.

Figure 3:
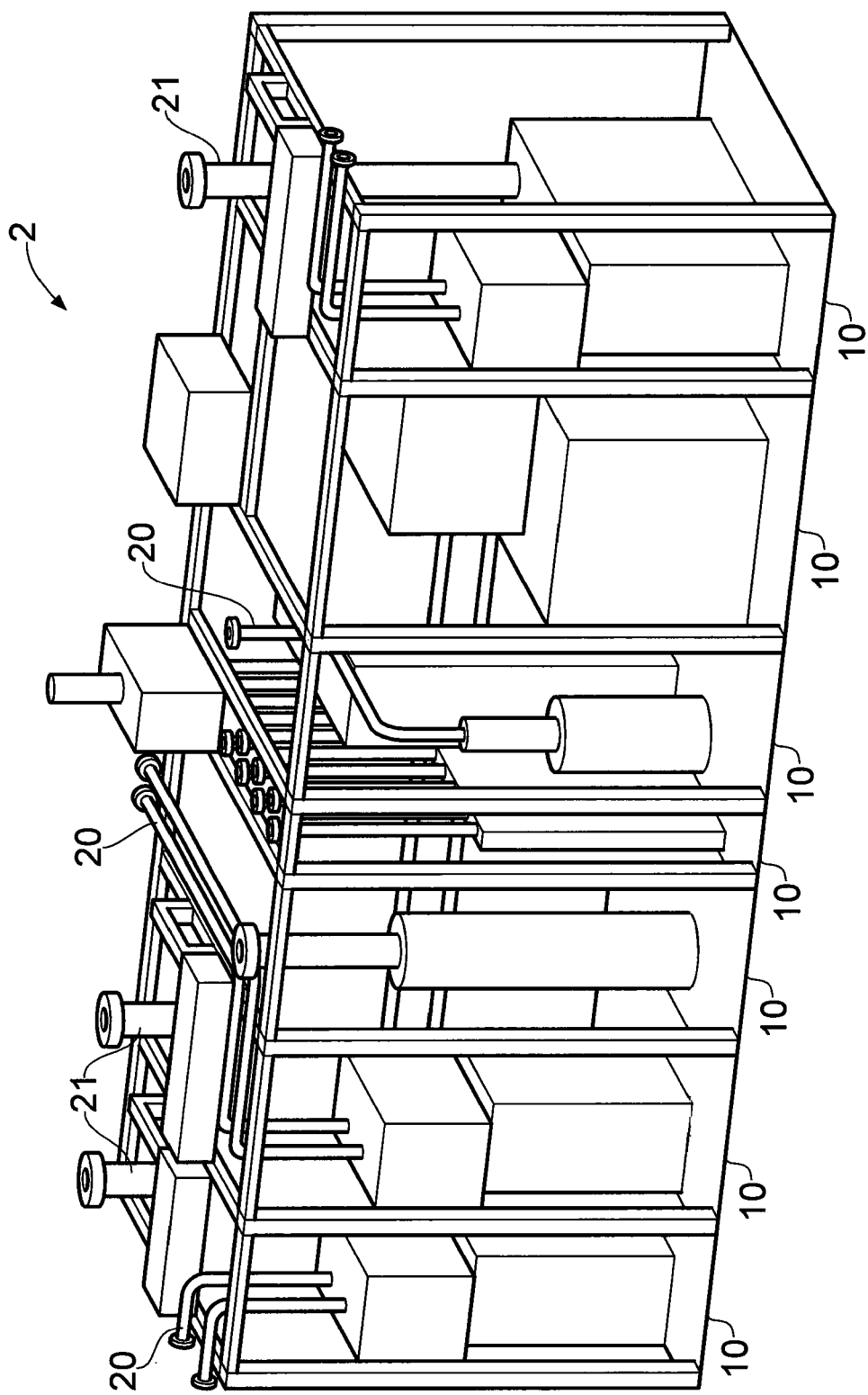
FIG. 3 is a schematic illustration (not to scale) showing a perspective view of the vacuum pumping and/or abatement system.

FIG. 3 is a schematic illustration (not to scale) showing a perspective view of the vacuum pumping and/or abatement system 2. The plurality of modules 10 of the system 2 are positioned in a side-by-side, contiguous arrangement and coupled together to form the system 2. Each module 10 is attached to one or more adjacent modules 10.

The system 2 comprises facilities lines 20 and vacuum pumping and/or abatement lines 21. The facilities lines 20 (e.g. facilities input lines 16, facilities distribution lines 18 and/or facilities connection lines 19 as described above) may include pipes (e.g. metal or polymer pipes) configured to permit the flow of facilities fluid therethrough and/or electrical or optical connections such as wires or optical fibres. The vacuum pumping and/or abatement lines 21 may include pipes (e.g. metal pipes) configured to permit the flow of pumped gas therethrough.

Figure 4:
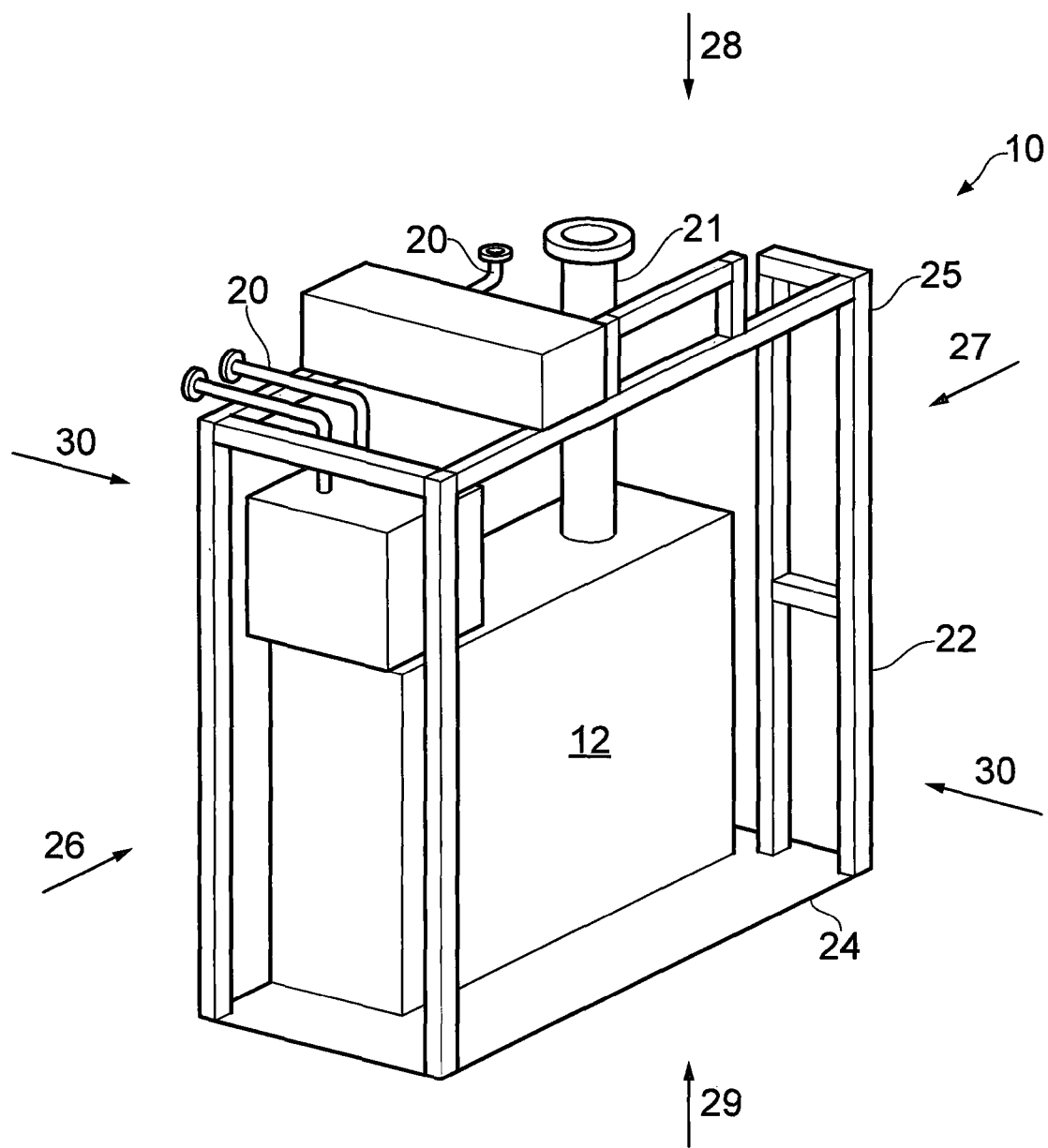
FIG. 4 is a schematic illustration (not to scale) showing a perspective view of a module of the vacuum pumping and/or abatement system.

FIG. 4 is a schematic illustration (not to scale) showing a perspective view of a module 10 of the vacuum pumping and/or abatement system 2.

The module 10 comprises a frame 22 and one or more apparatuses 12 disposed at least partially within the frame 22. In other words, the frame 22 defines a space and the one or more apparatuses 12 are at least partially disposed within the space. The module 10 also comprises a base 24 coupled to the frame 22. The frame 22 comprises a plurality of interconnected bars 25.

The module 10 has a front side 26, a rear side 27, a top side 28, a bottom side 29, and two opposing lateral sides 30.

The module 10 also comprises facilities lines 20 and vacuum pumping and/or abatement lines 21.

At least some of the facilities lines 20 may be lines which are configured to receive facilities fluid distributed by the facilities module 40, direct the facilities fluid through the module 10, and discharge the facilities fluid out of the module 10 (e.g. to another module or out of the system 2 entirely). At least some of the facilities lines 20 may be lines which are configured to convey electrical power, electrical signals, or optical signals from the facilities module 40 to the module 10.

The vacuum pumping and/or abatement lines 21 are configured to receive gas pumped from the entity 4, direct the pumped gas through the module 10, and discharge the pumped gas out of the module 10 (e.g. to another module or out of the system 2 entirely).

As described above, the system 2 comprises a facilities module 40, which will now be described in more detail with reference to FIG. 5.

Figure 5:
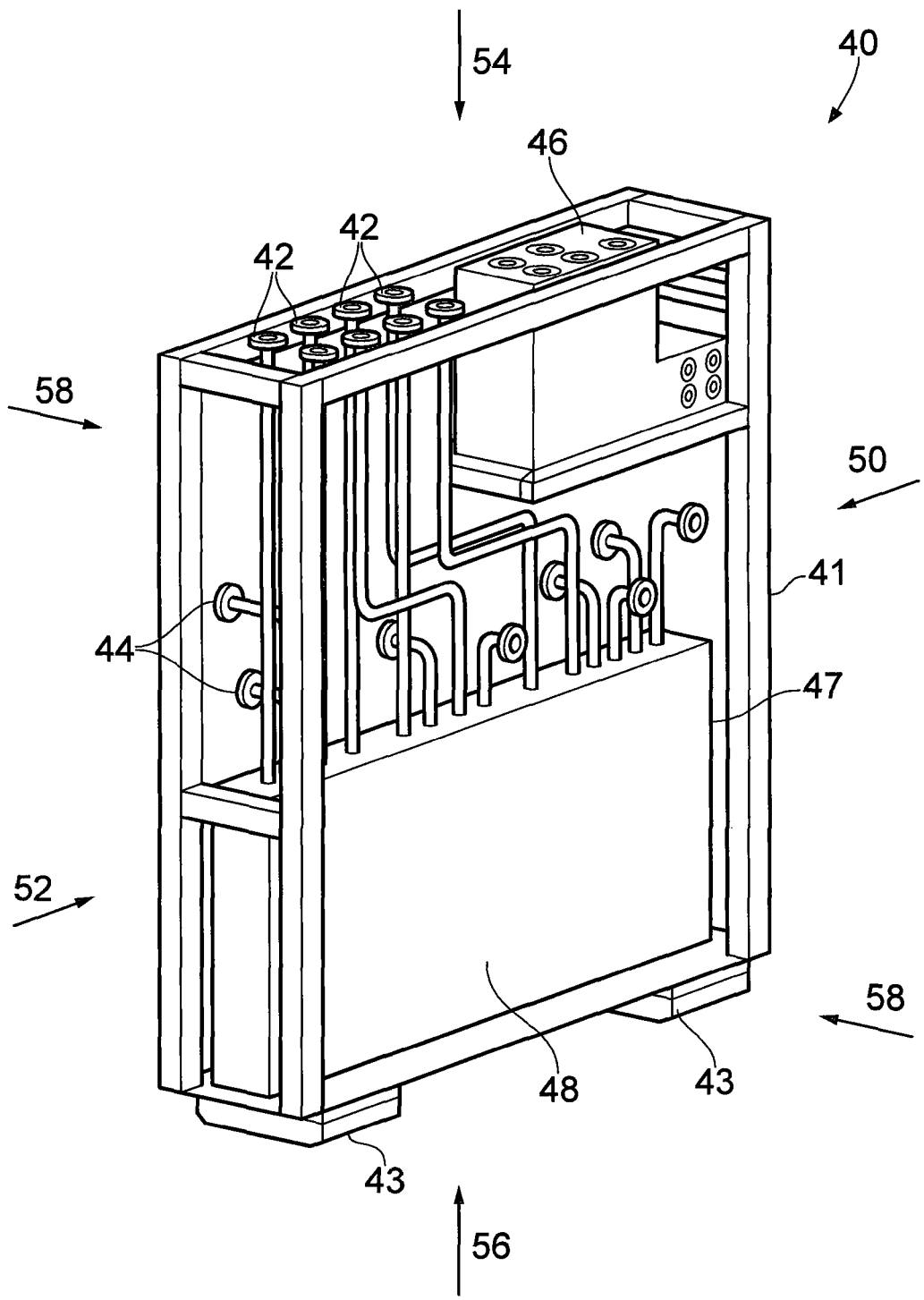
FIG. 5 is a schematic illustration (not to scale) showing a perspective view of a facilities module of the vacuum pumping and/or abatement system.

FIG. 5 is a schematic illustration (not to scale) showing a perspective view of the facilities module 40.

The facilities module 40 comprises a frame 41, a plurality of facilities inputs 42, a plurality of facilities outputs 44, a tool interface 46, and a controller 48.

The facilities module 40 has a front side 50, a rear side 52 opposite to the front side 50, a top side 54, a bottom side 56 opposite to the top side 54, and two opposing lateral sides 58.

The frame 41 defines a space in which other parts of the facilities module 40 are at least partially, and more preferably wholly, located. For example, all or part of the controller 48 may be located within the space defined by the frame 41. The frame 41 also acts as a support structure to which other parts of the facilities module 40 can be mounted. In this embodiment, the frame 41 comprises two feet 43 on which the facilities module 40 rests. The feet 43 are adjustable in height to enable a height of the facilities module 40 to be altered. For example, the feet 43 may be extendable and retractable to enable the height of the facilities module 40 to be changed. This tends to allow the height of the facilities module 40 to be adjusted to a desired level in the system 2. The feet 43 are located at or proximate to the bottom side 29 of the facilities module 40.

The plurality of facilities inputs 42 are configured to receive facilities from the facilities supply 14 via the facilities input lines 16 described above with reference to FIG. 2. In this embodiment, each facilities input 42 is configured to receive a respective facility. For example, one of the facilities inputs 42 may be configured to receive facilities fluid, while another one of the facilities inputs 42 may be configured to receive electricity. It will be appreciated that a facilities input 42 which is configured to receive electricity will receive said electricity from an electricity supply of the facilities supply 14, and a facilities input 42 which is configured to receive facilities fluid will receive said facilities fluid from a facilities fluid supply of the facilities supply 14 which is separate to the electricity supply.

The plurality of facilities outputs 44 are configured to output facilities from the facilities module 40 to other modules 10 of the system 2 via the facilities distribution lines 18 described above with reference to FIG. 2. In this embodiment, each facilities output 44 is configured to output a respective facility. For example, one of the facilities outputs 44 may be configured to output facilities fluid, while another one of the facilities outputs 44 may be an electrical or optical output.

The plurality of facilities inputs 42 are connected to the plurality of facilities outputs 44 by facilities connection lines located at least partially, and more preferably wholly, within the space defined by the frame 41. The facilities connection lines are configured to convey facilities from the plurality of facilities inputs 42 to the plurality of facilities outputs 44.

The tool interface 46 is an interface between the facilities module 40 and a tool (not shown) which is external to the vacuum pumping and/or abatement system 2. The tool may, for example, be an industrial tool located in a chamber (e.g. an etching tool used in semi-conductor fabrication) that the vacuum pumping and/or abatement system 2 is used to pump gas from. The tool interface 46 is configured to be connected to the tool to receive a tool signal from the tool. The tool signal provides an indication a state of the tool, for example an indication of the particular operation that the tool is performing.

In this embodiment, the plurality of facilities inputs 42 are located at or proximate to a common side of the facilities module 40. More specifically, the plurality of facilities inputs 42 are located at or proximate to the top side 54. Each of the plurality of facilities outputs 44 is located at or proximate to a lateral side 58 of the facilities module 40. The tool interface 46 is located at or proximate to the top side 54 of the facilities module 40.

The controller 48 comprises a computer or one or more processors for implementing instructions and using data, including instructions and data in the form of a computer program or plurality of computer programs stored in or on a machine-readable storage medium such as computer memory, a computer disk, ROM, PROM etc., or any combination of these or other storage media.

The controller 48 is configured to control at least part (or all) of the vacuum pumping and/or abatement system 2 by sending one or more control signals to the parts of the system 2 that it is configured to control. More specifically, the controller 48 is configured to control supply of facilities received at the facilities inputs 42 out of the facilities outputs 44. For example, the controller 48 may be configured to send one or more control signals to open/close one or more valves in the facilities lines of the facilities module 40, thereby to control supply of facilities out of the facilities outputs 44.

The controller 48 is also configured to control operation of one or more vacuum pumping and/or abatement apparatuses of the system 2 which are remote from the facilities module 40. For example, the controller 48 may be configured to send one or more control signals to a vacuum pump in another module to adjust an operating speed of the vacuum pump.

In this embodiment, the controller 48 is also configured to receive one or more sensor signals from one or more sensors (not shown) in the system 2. The one or more sensors may include one or more sensors located in the facilities module 40. The one or more sensors may include one or more sensors located remotely from the facilities module 40 (e.g. in other modules 10 of the system 2). In this embodiment, at least some of the control performed by the controller 48 is based on the one or more sensor signals received by the controller 48. For example, the controller 48 may be configured to receive a sensor signal from a pressure sensor or meter in the facilities module 40 and to control supply of facilities out of the facilities module 40 based on the pressure sensor signal. In this way, the controller 48 is able to control the system 2 such that the system 2 operates safely and/or according to predetermined criteria.

In this embodiment, the controller 48 is located at or proximate to the bottom side 56 of the facilities module 40.

In this embodiment, the tool interface 46 is connected to the controller 48 and configured to transmit the tool signal to the controller 48. In this embodiment, at least some of the control performed by the controller 48 is based on the tool signal. For example, the controller 48 may control operation of remote vacuum pumping and/or abatement apparatus and/or supply of facilities based on the tool signal.

In this embodiment, the facilities module 40 further comprises a user interface (not shown). The user interface comprises a display which is configured to display information associated with the system 2. For example, the display may be configured to display information indicating pressure of a facilities fluid in the facilities module 40. The user interface is also configured to receive one or more user inputs (e.g. via buttons or a touchscreen of the user interface) from a user. The user interface is configured to send one or more command signals to the controller 48 based on the one or more user inputs. The one or more command signals command the controller 48 to control at least part of the vacuum pumping and/or abatement system 2 according to the user input.

In this embodiment, the user interface is located at or proximate to the front side 50 of the facilities module 40.

In this embodiment, the facilities module 40 comprises a drawer 47 which is slidably mounted to the frame 41 and configured to slide in and out of an opening in the frame 41. Also, in this embodiment, the controller 48 is mounted to the drawer 47 such that the controller 48 is able to slide out of the opening in the frame 41 along with the drawer 47. In this way, the controller 48 is at least partially removable from the space defined by the frame 41 such that it extends at least partially out of the space defined by the frame 41. This allows a user to access the controller 48 for maintenance and/or inspection of controller 48. This also tends to allow access to wiring associated with the controller and the controller itself 48 for maintenance and/or of inspection thereof. In this embodiment, the front of the drawer 47 is located at or proximate to the front side 50 of the facilities module 40.

The facilities module 40 has a width, a height and a depth. The width is the distance between the two lateral sides 58 of the facilities module 40. The height is the distance between the top and bottom sides 54, 56 of the facilities modules 40. The depth is the distance between the front and rear sides 50, 52 of the facilities module 40.

In this embodiment, the width of the facilities module 40 is less than or equal to 1 m, or preferably less than or equal to 0.5 m, or more preferably less than or equal to 0.4 m, or more preferably less than or equal to 0.3 m, or more preferably less than or equal to 0.2 m, or more preferably less than or equal to 0.15 m, or more preferably less than or equal to 0.14 m, or more preferably less than or equal to 0.13 m, or more preferably less than or equal to 0.12 m, or more preferably less than or equal to 0.11 m, or more preferably less than or equal to 0.10 m. The width may be in the range 130-140 mm (e.g. about 132 mm).

In this embodiment, the height of the facilities module 40 is in the range 190-200 cm (e.g. about 198 cm). In this embodiment, the depth of the facilities module 40 is in the range 130-140 cm (e.g. about 134 cm).

Advantageously, the facilities module described above tends to allow all of the facilities used by a vacuum pumping and/or abatement system to enter the system at a single location (i.e. the facilities module). This tends to allow installation or assembly of the system to be performed more easily, since a user of the system can connect their facilities supply to the system at one known location, rather than at multiple different locations.

Advantageously, the facilities module described above tends to allow easy connection of a tool to the system, due to the presence of the tool interface at a known location relative to the facilities inputs.

Advantageously, the facilities module described above tends to allow easy connection of the facilities outputs to other modules of the system, due to the presence of the facilities outputs at a known location relative to the facilities inputs.

Advantageously, the widths described above tend to allow the facilities inputs, facilities outputs, tool interface and controller to be compactly located in a relatively small amount of space within the system.

Thus, a facilities module for a vacuum pumping and/or abatement system is provided.

Figure 6:
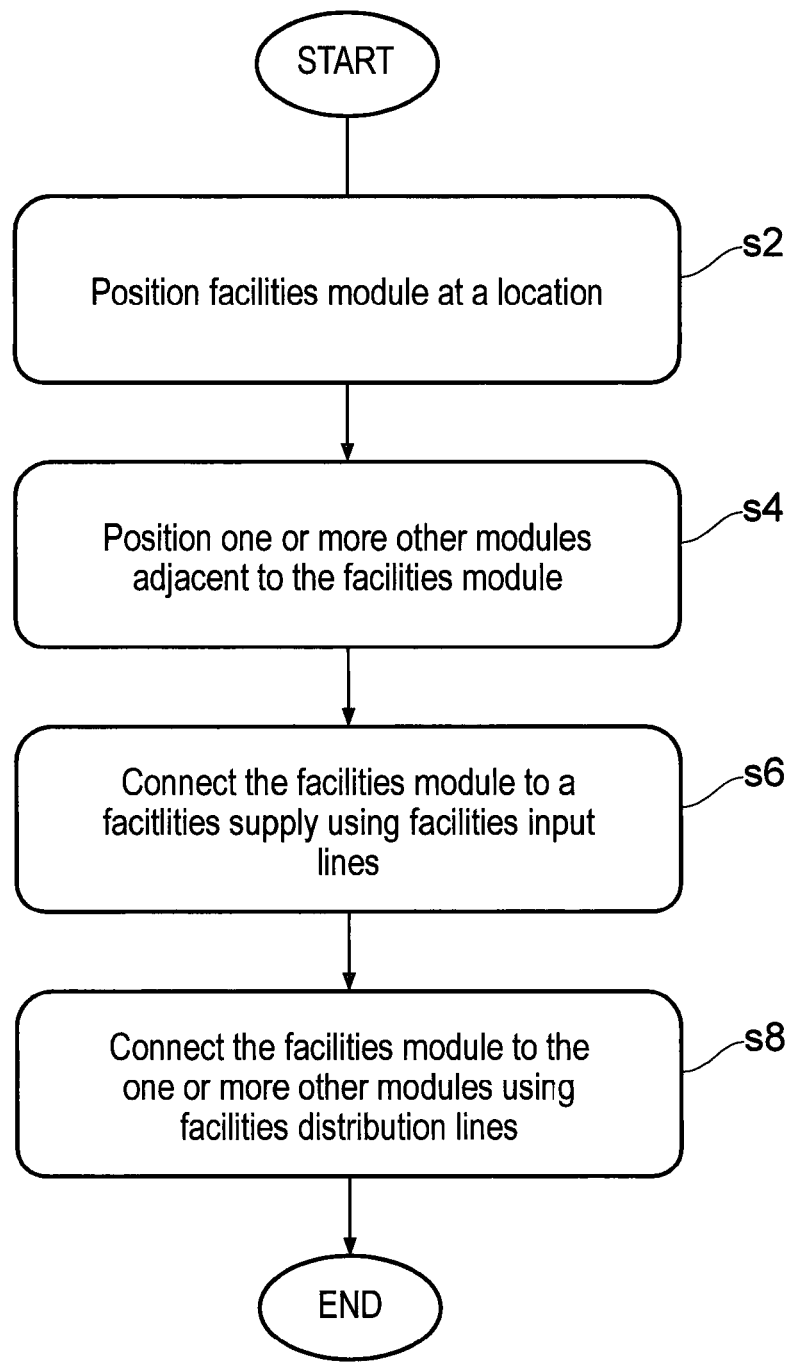
FIG. 6 is a flowchart showing a method for installing the vacuum pumping and/or abatement system.

FIG. 6 is a flowchart showing a method for installing a vacuum pumping and/or abatement system. This method is used to install the system at a particular desired location, such as a user's factory.

It should be noted that some of the process steps depicted in the flowchart of FIG. 6 and described below may be omitted or performed in differing order to that presented below and shown in FIG. 6. Furthermore, although the process steps have, for convenience and ease of understanding, been depicted as discrete temporally-sequential steps, nevertheless some of the process steps may in fact be performed simultaneously or at least overlapping to some extent temporally.

At step s2, a user positions the facilities module 40 described above at a location. For example, the user may position the facilities module 40 below a tool used in an industrial processing factory.

At step s4, the user positions one or more other modules 10 of the vacuum pumping and/or abatement system adjacent to the facilities module 40. For example, the user may position another module 10 adjacent to one of the lateral sides 58 of the facilities module 40.

At step s6, the user connects the plurality of facilities inputs 42 of the facilities module 40 to the facilities supply 14 using facilities input lines 16.

At step s8, the user connects the plurality of facilities outputs 44 of the facilities module 40 to the one or more other modules 10 using facilities distribution lines 18.

Thus, a method for installing a vacuum pumping and/or abatement system is provided.

Advantageously, the above-described method for installing a vacuum pumping and/or abatement system tends to make use of a facilities module as a starting point of reference for installing the rest of the system. In other words, the facilities module is installed first and used as a "datum" for installing the rest of the system. This advantageously tends to allow the system to be installed or assembled more easily by a user of the system.

In the above embodiments, the plurality of facilities inputs are located at or proximate to the top side of the facilities module. However, in other embodiments, one or more of the facilities inputs are located at or proximate to a different side, e.g. the rear side.

In the above embodiments, the plurality of facilities outputs are each located at or proximate to a lateral side of the facilities module. However, in other embodiments, one or more of the facilities outputs are located at or proximate to a different side, e.g. the rear side or top side.

In the above embodiments, the tool interface is located at or proximate to the top side of the facilities module. However, in other embodiments, the tool interface is located at or proximate to a different side, e.g. the rear side. In some embodiments, the tool interface is omitted.

In the above embodiments, the controller is located at or proximate to the bottom side of the facilities module. However, in other embodiments, the controller has a different location in the facilities module, e.g. at or proximate to the top side.

In some embodiments, at least part of the vacuum pumping and/or abatement system is not controlled by the controller of the facilities module and may, for example, be controlled instead by a controller in a module other than the facilities module, a controller remote from the system, or manually by a user.

In the above embodiments, the facilities module comprises a user interface. However, in other embodiments, the user interface is omitted.

In the above embodiments, the facilities module comprises two adjustable feet. However, in other embodiments, the facilities module may have a different number of adjustable feet, for example a single adjustable foot or more than two adjustable feet. In some embodiments, the adjustable feet are omitted.

In the above embodiments, the facilities module comprises a drawer. However, in other embodiments, the facilities module does not comprise a drawer.

In some embodiments, the facilities module may have a different width, height and/or depth to those described above.

The invention claimed is:

1. A vacuum pumping and/or abatement system, the system comprising:
   a facilities module; and
   one or more other modules connected to the facilities module, wherein at least one of the one or more other modules comprises a vacuum pumping and/or abatement apparatus; and wherein the facilities module comprises:
      a frame defining a space;
      a plurality of facilities inputs configured to receive facilities from a facilities supply;
      a plurality of facilities outputs configured to output the received facilities out of the facilities module;
      a plurality of facilities connection lines located at least partially within the space defined by the frame, the plurality of facilities connection lines connecting the facilities inputs to the facilities outputs; and
      a controller configured to:
         control supply of facilities received at the facilities inputs out of the facilities outputs; and
         control operation of one or more vacuum pumping and/or abatement apparatuses remote from the facilities module.

2. The system of claim 1, wherein the facilities module has a width which is less than or equal to 0.5 m.

3. The system of claim 2, wherein the facilities module has a width which is less than or equal to 0.15 m.

4. The system of claim 1, wherein the facilities module further comprises a tool interface configured to receive a tool signal from a tool, and wherein at least some of the control performed by the controller is based on the tool signal.

5. The system of claim 1, wherein the plurality of facilities inputs are located at or proximate to a common side of the facilities module.

6. The system of claim 1, wherein the plurality of facilities outputs are each located at or proximate to a lateral side of the facilities module.

7. The system of claim 4, wherein the tool interface is located at or proximate to a top side of the facilities module.

8. The system of claim 5, wherein the common side is a top side of the facilities module.

9. The system of claim 1, wherein the facilities module further comprises a user interface configured to:
   display information associated with the vacuum pumping and/or abatement system;
   receive a user input; and
   send a signal to the controller based on the user input.

10. The system of claim 1, wherein the facilities module further comprises a drawer slidably mounted to the frame and configured to slide in and out of an opening in the frame, and wherein the controller is mounted to the drawer such that the controller is able to slide out of the opening in the frame along with the drawer.

11. The system of claim 1, wherein the frame comprises at least one foot which is configured to be adjusted to vary a height of the facilities module.

12. The system of claim 1, wherein the facilities include one or more facilities selected from the group consisting of: facilities fluid, electrical power, electrical signals, and optical signals.

13. The system of claim 12, wherein the facilities include facilities fluid selected from the group consisting of: liquid coolant, city water, de-ionised water, clean dry air, methane, oxygen, nitrogen, and hydrogen.

14. A method for installing the vacuum pumping and/or abatement system of claim 1, the method comprising:
   positioning the facilities module at a location;
   positioning the one or more other modules of the vacuum pumping and/or abatement system adjacent to the facilities module;
   connecting the plurality of facilities inputs of the facilities module to the facilities supply using a plurality of facilities input lines; and
   connecting the plurality of facilities outputs of the facilities module to the one or more other modules using facilities distribution lines.

* * * * *